Dec. 22, 1970 L. J. BUSZKO ET AL 3,549,401

METHOD OF MAKING ELECTROLUMINESCENT GALLIUM PHOSPHIDE DIODES

Filed Dec. 20, 1966 2 Sheets-Sheet 1

INVENTORS
LEONARD J. BUSZKO
LUTHER M. FOSTER
MAX R. LORENZ

BY George Baron

ATTORNEY

United States Patent Office 3,549,401

Patented Dec. 22, 1970

3,549,401

METHOD OF MAKING ELECTROLUMINESCENT GALLIUM PHOSPHIDE DIODES

Leonard J. Buszko, Bronx, Luther M. Foster, Chappaqua, and Max R. Lorenz, Mahopac, N.Y., assignors to International Business Machines Corporation, Armonk, N.Y., a corporation of New York Filed Dec. 20, 1966, Ser. No. 603,373
Int. Cl. H01l 7/38
U.S. Cl. 148—175 6 Claims

ABSTRACT OF THE DISCLOSURE

Gallium phosphide light emitting diodes with controlled amounts of the p-type impurity zinc and the n-type impurity oxygen in the p region immediately adjacent the junction are prepared by epitaxial growth from a solution. An n-type wafer of gallium phosphide having a highly polished surface is placed in a chamber together with a mixture containing GaP, Ga, Zn, and $Ga_2O_3$. The chamber is evacuated, then filled with an inert gas and the mixture is then heated to about 1150° C. to form a liquid solution of gallium phosphide, zinc and oxygen dissolved in gallium. The container is then tipped so that the solid solution contacts the polished surface, and thereafter the wafer and solution are cooled to epitaxially grow the p-type gallium phosphide doped with zinc and oxygen in the desired amounts.

BACKGROUND OF THE INVENTION

Presently available methods of manufacturing red-emitting gallium phosphide diodes, prior to this invention, employ various procedures for applying an n-type region to a single crystal platelet of GaP that has been produced by precipitation from a zinc and oxygen doped dilute solution of gallium phosphide dissolved in gallium to form a p-n junction. The crystal platelets so produced are very nonuniform in size and morphology and have a considerable gradient of dopant concentration from the surface to the interior of each platelet. An n-type layer or region is applied to such a p-type GaP platelet after the latter has been lapped and polished to produce a p-n junction needed for electroluminescence. For high efficiency electroluminescence in the red region of the spectrum, the zinc and oxygen concentrations in the p-type region immediately adjacent to the junction are extremely critical, since it is from this region that the emission originates.

This critical concentration cannot be achieved in a reproducible manner when the solution-grown platelets are used because of their irregular size and morphology and because of wide variations in dopant concentration throughout the platelets.

SUMMARY OF INVENTION

The present invention starts out with an n-type crystal that can be produced in a variety of ways, since the dopant control in this crystal is not critical. A solution regrowth technique is employed to deposit an oxygen-zinc doped p-type GaP layer onto such n-type crystal. Such regrowth technique will be described hereinafter but the technique is set forth in detail in an article entitled "Epitaxial Growth from the Liquid State and Its Application to the Fabrication of Tunnel and Laser Diodes," H. Nelson, RCA Review, December 1963, pages 603–615. Such solution regrowth technique allows one to critically dope with suitable dopants, i.e., zinc and oxygen, at the precise location where close composition control is required to attain an efficient and reproducible device.

To accomplish such desired reproducibility, a GaP wafer, previously doped to be n-type with a dopant selected from Te, Se, S, Sn, Si, or other shallow donors, is lapped, polished and chemically etched. The wafer is anchored in one end of a quartz boat or any boat that is non-reactive with the materials to be placed therein. At the other end of the boat, a measured quantity of Ga, GaP, an oxygen-containing compound, such as $Ga_2O_3$ or ZnO, and an acceptor, such as Zn or Cd, are placed. If ZnO is used, the zinc that it contains is taken into account in determining the total acceptor required. The boat is sealed in a quartz capsule together with a partial pressure of non-reactive gas to suppress material transport via the vapor phase.

The sealed capsule is located in a furnace so that the capsule is either a uniform temperature or the wafer end is slightly colder than any other portion of the capsule. The assembly is heated to a temperature that homogenizes the constituents in the gallium. The furnace is tilted so that gallium solution flows over the wafer, after which the assembly is cooled to cause precipitation of Zn-O doped GaP epitaxially onto the wafer. When the boat is cooled to room temperature, the wafer and its overgrowth are cleaned of excess gallium mechanically and with acid, and then lapped to desired thickness and smoothness. Ohmic contacts are applied to both faces, either before or after cutting to the desired shape and size. Examples of contact material would be Au-Sn alloy for the n-side and Au-Zn for the p-side. The finished diode is mounted in a holder or support such that current can be passed across the p-n junction.

Thus, it is an object of this invention to provide very efficient light-emitting GaP diodes.

It is yet another object to provide a method of manufacture of light-emitting GaP diodes that will enhance uniformity of characteristics of such diodes.

A further object is to greatly relax the present stringent requirements of manufacture of red-emitting GaP diodes.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Figure 3:
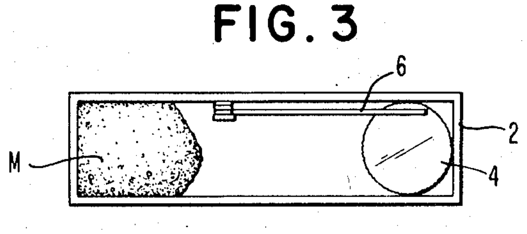
FIGS. 3, 4 and 5 are respectively the top, side and front views of the quartz boat and its contents used in the manufacturing of GaP diodes.
Figure 4:
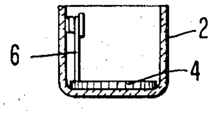
Figure 5:
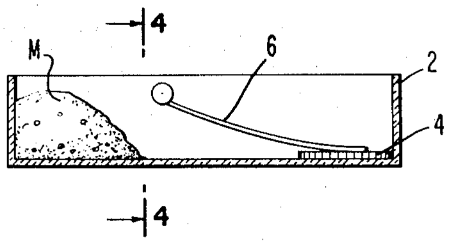

FIGS. 3, 4 and 5 show a quartz boat 2 that has been sandblasted to form a rough surface on its inside. The quartz boat (and other quartz items subsequently to be described) is etched in equal parts of HF and $HNO_3$ for 30 minutes, followed by a rinse in deionized water and drying in an oven. An n-type wafer 4 is lapped on both sides and that surface of the wafer 4 on which there is to be epitaxial overgrowth is mechanically polished. Many types of n-type wafers can be used. Representative, though not limiting, are wafers grown from a gallium solution; Te-doped wafers grown from a Ga-Bi solution; nominally undoped but n-type wafers grown from a Bi solution; and Te-doped wafers produced by vapor phase reactions.

Figure 1:
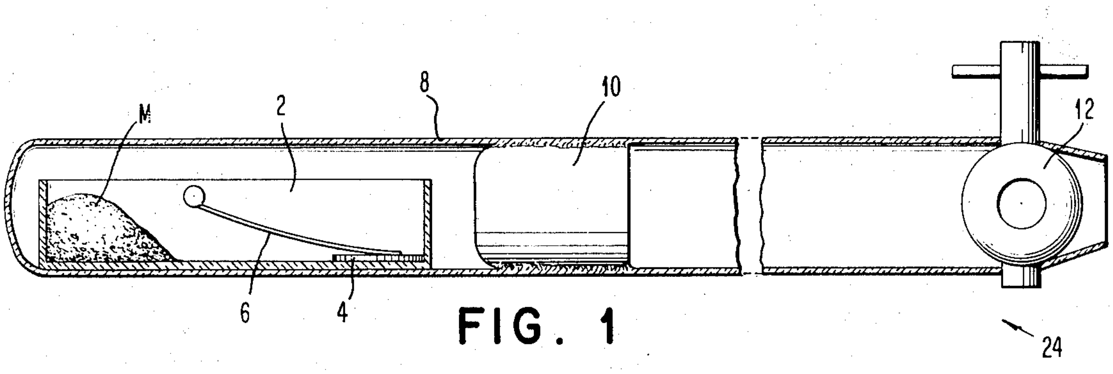
FIG. 1 is a schematic showing how a boat is loaded prior to being placed into a furnace.

The substrate wafer 4 is etched in hot $HCl+H_2O$ (1:1) for approximately 45 seconds, rinsed in deionized water and acetone and then pinned to the floor of boat 2 by a quartz rod 6. As is seen in FIG. 1, weighed amounts of Ga, GaP, $Ga_2O_3$ and Zn are placed into boat 2 away from substrate 4. A representative mixture M would consist of 5 gms. of Ga, 1 gm. of GaP, 6.5 milligrams of zinc and 16.5 milligrams of $Ga_2O_3$. The boat 2 and its contents are placed in quartz ampoule 8 and a quartz sealing plug 10 is located about ¼ inch from one end of boat 2. The ampoule 8 and its contents are placed on a vacuum system (not shown) which is evacuated until a pressure of about $10^{-6}$ mm. of Hg is reached, at which time a stopcock 12 seals off the evacuated ampoule 8. The vacuum system is flushed out with forming gas, such as a mixture of nitrogen and hydrogen (9:1), such flushing out being repeated several times, and ampoule 8 is opened to the vacuum system and is backfilled with approximately 150 mm. of forming gas. Stopcock 12 again separates ampoule 8 from its vacuum system. The area 24, where the sealing plug 10 is located, is heated with a torch until the ampoule wall collapses and makes a sealing fused contact with plug 10.

Figure 2:
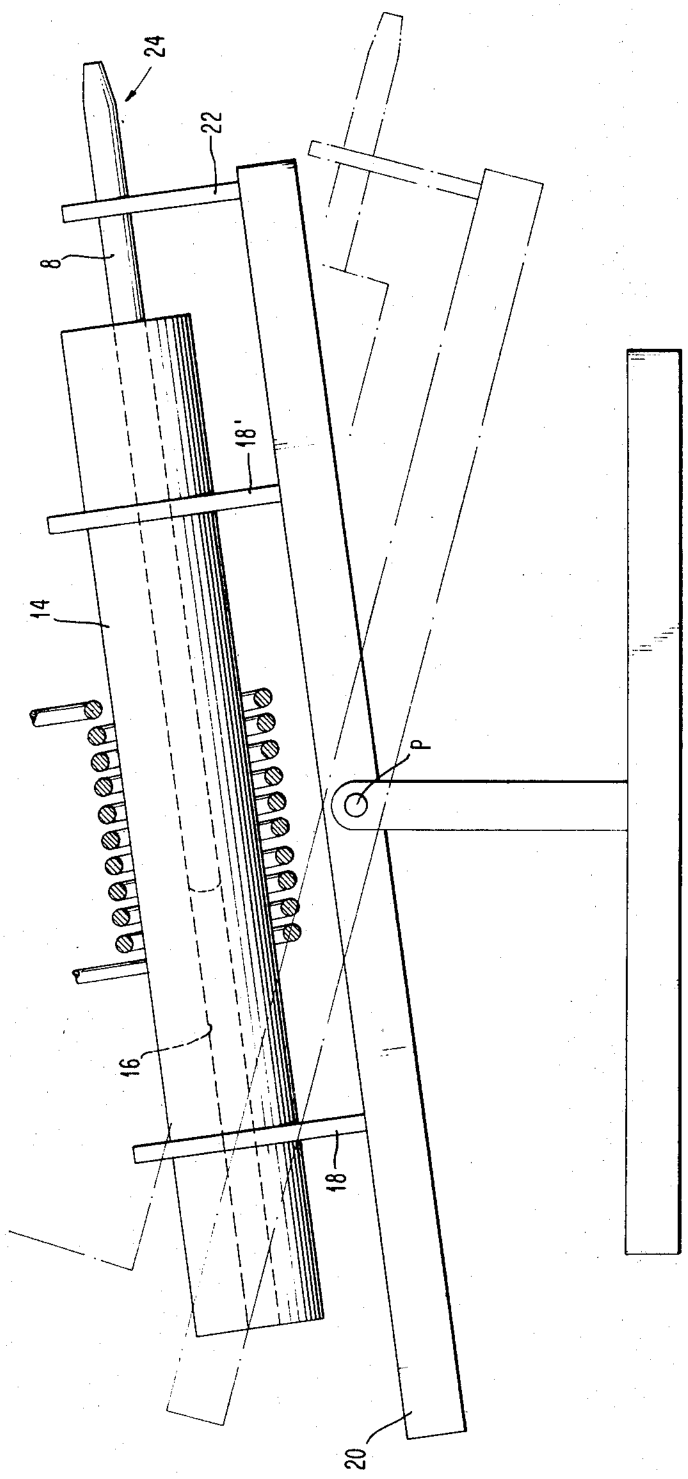
FIG. 2 is a showing of a tiltable furnace employed in the practice of the invention.

The furnace 14 (FIG. 2), is a conventional resistance wound heating unit having an opening 16 therein for accommodating ampoule 8 and its contents. Furnace 14 is supported by clamps 18 and 18' onto a pivotal base 20 capable of being tilted about pin P, and apertured arm 22 serves as a support for one end of ampoule 8.

After insertion of the ampoule 8 having the sealed plug 10 into the furnace 14, the latter is brought up to a temperature of 1150° C.–1160° C. in about 30 minutes and maintained at that temperature for approximately 10 to 15 minutes. The temperature range of operation is from 800° C.–1200° C. with 1150° C. being the preferred temperature. The 10 to 15 minutes are generally sufficient to allow the solution, i.e., the liquid mass M, to reach equilibrium. The tilting of base 20 causes the liquid mass M to roll over onto substrate 4. The furnace is held in such tilted position and at the elevated temperature of 1150° C.–1160° C. for about 5 minutes. Then the furnace is cooled to 700° C. at a rate of 9° C./hr. allowing for epitaxial growth.

In liquid-phase epitaxial growth, the p-n junction formed is planar and parallel to the faces of the n-type wafer serving as the substrate, assuring a planar, uniform p-n junction. At 700° C., the ampoule 8 is removed and allowed to cool to room temperature, the excess overgrowth material is mechanically removed from the surface of the substrate 4, and any residue is removed chemically prior to preparing it for those subsequent steps that will produce a diode.

Figure 6:
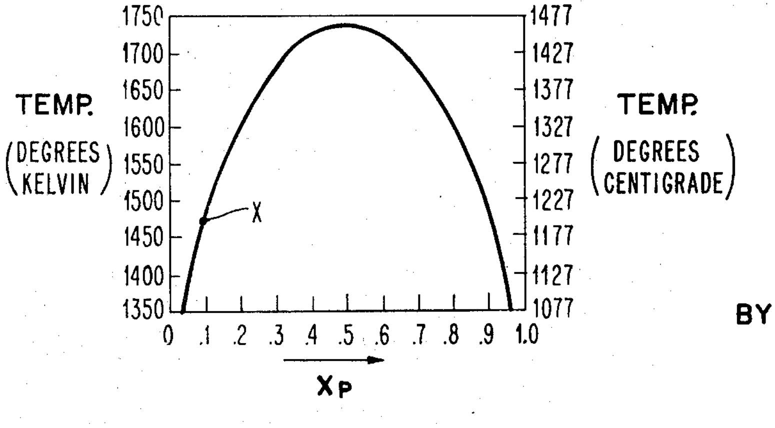
FIG. 6 is a plot of a GaP liquidus curve.

Reference to FIG. 6 will serve as an aid in better understanding the nature of applicants' contribution. In the Ga-P liquidus curve, the left portion of the abscissa starts with no atomic fraction of phosphorus and reaches a fraction of 1 at the right end of the abscissa, whereas the left end of the abscissa indicates an atomic fraction of 1 for gallium and no gallium at the right end. For a point X on the liquidus curve that is approximately 1200° C., the atomic fraction of GaP is 0.9 Ga and 0.1 P. Assume that, as is done in the prior art, Zn and O doped GaP are dissolved in Ga by heating the mixture to 1200° C. As this solution is gradually cooled, crystal platelets of GaP precipitate. However, because the composition of the melt continually changes as the temperature traces down the liquidus line, both with respect to the Ga-P ratio and the concentration of dopants, the composition of the crystals varies from one to another and from the center to surface of any one crystal. By the use of the method taught herein, the temperature at which first precipitation takes place is accurately controlled and this gallium phosphide layer, critically doped with zinc and oxygen, is applied at the precise location in the GaP crystal where close composition control determines the efficiency of the GaP electroluminescent diode that will be produced.

While Zn and oxygen are chosen as the preferred dopants to obtain a red-emitting GaP diode, germanium can be substituted for oxygen. What is sought as a donor dopant in this invention is one that is characterized as a "deep lying" donor, namely, one whose energy level is considerably removed from its conduction band. Consequently, where double-doped GaP is made as a red-emitting electroluminescent diode, other deep lying donors can be substituted for oxygen or germanium in the practice of this invention.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of making a red-emitting GaP luminescent diode comprising the steps of:
- preparing an n-type wafer having a highly polished surface,
- placing such wafer separately from but conjointly with a mixture of Gap, Ga, Zn and $Ga_2O_3$ in a sealed chamber containing an inert gas to prevent vapor mass transport,
- heating said mixture and wafer to a temperature of the order of 1150° C. in said sealed chamber until said mixture forms a zinc and oxygen doped solution of GaP dissolved in gallium,
- turning said chamber so as to cause said solution to cover said polished surface, and
- gradually cooling said chamber for a time sufficient to effect a precipitation of doubly doped GaP epitaxially onto said polished surface to form a p-n junction.

2. A method of making a red-emitting GaP luminescent diode comprising the steps of:
- preparing an n-type substrate having a highly polished surface,
- placing such substrate separately from but conjointly with a mixture of GaP, Ga, a donor dopant oxygen and an acceptor dopant zinc in an $N_2$ and $H_2$ containing chamber,
- heating said mixture and substrate in said sealed chamber to a temperature sufficient to melt said mixture into a double-doped solution of GaP dissolved in Ga, and
- covering said polished surface with said solution and cooling for a time sufficient to effect a precipitation of doubly doped GaP epitaxially onto said polished surface to form a p-n junction, and
- gradually cooling said substrate and its epitaxial overgrowth to room temperature.

3. A method of making a red-emitting gallium phosphide junction for use in luminescent diodes comprising the steps of:
- preparing an n-type wafer having a highly polished surface,
- affixing said wafer to one end of a refractory container with its polished surface exposed,
- locating a measured amount of GaP, Ga, Zn and $Ga_2O_3$ to form a mixture at another end of said container,
- evacuating said container, then back filling it with $N_2$ and $H_2$ to a pressure of 150 mm. Hg and sealing the container,
- heating said container to a temperature of the order of 1150° C. until said mixture forms a zinc and oxygen doped solution of GaP dissolved in gallium,
- tipping said container so that said solution covers said polished surface, holding the temperature at about 1150° C. for 5 minutes, cooling to 700° C. at a rate of 9° C./hr., and then cooling to room temperature.

4. The method of claim 3 wherein the ratio of gallium to GaP to $Ga_2O_3$ to Zn is 5 gms., 1 gm., 16.5 milligrams and 6.5 milligrams.

5. A method of making light emitting gallium phosphide p-n junction diodes in which the p region immediately adjacent the junction from which the light emission is produced is critically doped with controlled amounts of an acceptor impurity zinc and a donor impurity oxygen comprising the steps of:

(a) preparing an n-type wafer of gallium phosphide;
(b) placing said wafer and a mixture containing gallium phosphide, gallium, zinc and oxygen in a closed chamber;
(c) heating said wafer and mixture at a temperature at which the mixture melts to provide a liquid solution containing gallium phosphide, zinc and oxygen dissolved in gallium;
(d) and bringing said solution and said wafer into contact with each other and thereafter cooling said solution and wafer to epitaxially grow crystalline p-type gallium phosphide from said solution on said wafer and form thereby a gallium phosphide crystal having a p-n junction with the region on the epitaxially grown p side of the junction which is immediately adjacent the junction doped with controlled amounts of the acceptor impurity zinc and the donor impurity oxygen.

6. The method of claim 5 wherein said mixture is heated to a temperature in the order of 1150° C. in said chamber.

References Cited

UNITED STATES PATENTS

| | | | |
|---|---|---|---|
| 3,371,051 | 2/1968 | Johnson et al. ---- | 252—62.3X |
| 3,394,085 | 7/1968 | Westerveld et al. -- | 252—62.3X |
| 3,411,946 | 11/1968 | Tramposch -------- | 148—1.6X |

OTHER REFERENCES

H. Nelson, RCA Review, December 1963, pp. 603–615.

L. DEWAYNE RUTLEDGE, Primary Examiner
R. A. LESTER, Assistant Examiner

U.S. Cl. X.R.

117—201; 148—1.5, 1.6, 172, 173; 252—62.3